United States Patent
Mori et al.

(10) Patent No.: US 8,570,455 B2
(45) Date of Patent: Oct. 29, 2013

(54) SEMICONDUCTOR DEVICE, SEMICONDUCTOR DEVICE MANUFACTURING METHOD, LIQUID CRYSTAL DISPLAY DEVICE AND ELECTRONIC APPARATUS

(75) Inventors: Shigeru Mori, Kanagawa (JP); Isao Shouji, Kanagawa (JP); Hiroshi Tanabe, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 315 days.

(21) Appl. No.: 12/934,659

(22) PCT Filed: Mar. 30, 2009

(86) PCT No.: PCT/JP2009/056517
§ 371 (c)(1),
(2), (4) Date: Sep. 27, 2010

(87) PCT Pub. No.: WO2009/123127
PCT Pub. Date: Oct. 8, 2009

(65) Prior Publication Data
US 2011/0013107 A1  Jan. 20, 2011

(30) Foreign Application Priority Data
Apr. 2, 2008 (JP) .................... 2008-096530

(51) Int. Cl.
*G02F 1/136* (2006.01)
*H01L 21/336* (2006.01)
*H01L 21/62* (2006.01)
*H01L 29/66* (2006.01)

(52) U.S. Cl.
USPC ............... 349/43; 349/42; 257/290; 257/336; 438/290

(58) Field of Classification Search
USPC .......... 349/46, 42–43; 257/290, 336; 438/290
See application file for complete search history.

(56) References Cited

U.S. PATENT DOCUMENTS

| 6,204,138 B1 | 3/2001 | Krishnan et al. |
| 6,365,917 B1 | 4/2002 | Yamazaki |

(Continued)

FOREIGN PATENT DOCUMENTS

| EP | 0 544 229 | 6/1993 |
| EP | 1 005 093 | 5/2000 |

(Continued)

OTHER PUBLICATIONS

International Search Report—PCT/JP2009/056517—Jun. 16, 2009.

(Continued)

*Primary Examiner* — Nathanael R Briggs
(74) *Attorney, Agent, or Firm* — Young & Thompson

(57) ABSTRACT

A semiconductor device includes a supporting substrate; a semiconductor film on the supporting substrate; a gate insulating film on the semiconductor film; a gate electrode on the gate insulating film; and a source region and a drain region formed by introducing impurity elements to the semiconductor film. The thickness of the semiconductor film is within the range of 20 nm to 40 nm. Low-concentration regions are provided between the source region and a channel forming region, and between the drain region and the channel forming region, respectively. The low-concentration regions each have an impurity concentration smaller than that of the source region and that of the drain region, and the impurity concentration in a lower surface side region on the side of the supporting substrate is smaller than that of an upper surface side region on the opposite side.

12 Claims, 13 Drawing Sheets

(56) References Cited

U.S. PATENT DOCUMENTS

| | | |
|---|---|---|
| 6,429,485 B1 | 8/2002 | Ha et al. |
| 6,479,867 B2 * | 11/2002 | Itoga et al. .................. 257/347 |
| 6,593,592 B1 | 7/2003 | Yamazaki et al. |
| 6,812,492 B1 | 11/2004 | Choi |
| 7,218,361 B2 | 5/2007 | Yamazaki et al. |
| 7,486,344 B2 | 2/2009 | Yamazaki et al. |
| 7,888,702 B2 | 2/2011 | Akimoto et al. |
| 2001/0052950 A1 | 12/2001 | Yamazaki et al. |
| 2002/0074550 A1 | 6/2002 | Itoga et al. |
| 2006/0231858 A1 * | 10/2006 | Akimoto et al. ............ 257/140 |
| 2006/0231868 A1 * | 10/2006 | Yamada et al. ............. 257/239 |

FOREIGN PATENT DOCUMENTS

| | | |
|---|---|---|
| JP | 60-136262 | 7/1985 |
| JP | 03-203378 | 9/1991 |
| JP | 09-082974 | 3/1997 |
| JP | 09-260671 | 10/1997 |
| JP | 10-256557 | 9/1998 |
| JP | 2000-223714 | 8/2000 |
| JP | 2000-284722 | 10/2000 |
| JP | 2001-345453 | 12/2001 |
| JP | 2002-185008 | 6/2002 |
| JP | 2005-026705 | 1/2005 |
| JP | 2006-317926 | 11/2006 |
| JP | 2006-324626 | 11/2006 |
| JP | 2007-088432 | 4/2007 |
| JP | 2008-153641 | 7/2008 |
| WO | 01/67169 | 9/2001 |

OTHER PUBLICATIONS

Chinese Official Action issued Feb. 3, 2012 by the Chinese Patent Office in Chinese Patent Application No. 2009801114181, with English translation, 13 pages.
European Search Report—09728673.6—Oct. 12, 2012.
Japanese Official Action—2010-505905—Aug. 13, 2013.

* cited by examiner

SEMICONDUCTOR DEVICE, SEMICONDUCTOR DEVICE MANUFACTURING METHOD, LIQUID CRYSTAL DISPLAY DEVICE AND ELECTRONIC APPARATUS

TECHNICAL FIELD

The present invention relates to a semiconductor device, a method of manufacturing the same, and a liquid crystal device and an electronic apparatus equipped with the same.

BACKGROUND ART

Recently-developed liquid crystal displays generally include a liquid crystal panel and a backlight unit. A liquid crystal panel of the liquid crystal displays includes a pair of transparent supporting substrates retaining liquid crystals therebetween, data lines and scan lines formed on one supporting substrate, a common electrode formed on another supporting substrate, and polarizers arranged on planes of incidence and projection, respectively, of the liquid crystal panel.

The data lines and scan lines are provided to divide display regions of the liquid crystal panel into a plurality of pixels, each pixel being provided with a pixel electrode, together with a semiconductor apparatus such as a thin film transistor (TFT) or the like. A drain region of the TFT is connected to the pixel electrode, a source region thereof is to the data lines, and a gate is to the scan lines.

The TFT performs a switching operation according to signals from the scan lines, and through which electric current flows between the data lines and the pixel electrode. Consequently, an electric field is produced between the pixel electrode and the common electrode, and enables liquid crystal molecules on the pixel electrode to change the array thereof.

Light from the backlight unit is incident upon the liquid crystal panel through the polarizer on the side of the plane of incidence. Here, light rays in the same polarization direction as a polarizing plane of the polarizer are incident upon the liquid crystal panel. TFTs of the respective pixels are controlled according to image data to be displayed, together with the polarized state of liquid crystals in the respective pixels. Incident rays of light are polarized depending upon the polarized state of liquid crystals and are incident upon the polarizer on the side of the plane of projection. Only the light rays having the same polarization direction as that of the polarizing plane are projected, so that image data are displayed as optical density of luminance.

The TFT is formed by implanting impurities on patterned polycrystalline silicon on a supporting substrate such as glass or the like so as to form a source region (electrode) or a drain region (electrode), and then performing an annealing process to activate the impurities.

Since a semiconductor such as polycrystalline silicon generates optical excitation due to incident light, if light from the backlight unit is incident upon the TFT, leakage photocurrent is generated by optically excited carriers.

Since the leakage photocurrent flows irrespective of signals from the scan lines, even when the TFT is in an OFF state, current flows between the data lines and the pixel electrode. This OFF-state current (OFF current) makes a flicker generated, incurring a poor image quality of the screen of the liquid crystal display device.

Thus, Patent Document 1 (WO 01/067169) proposed a technology of restricting leakage photocurrent from being generated by using a p-type TFT including a full-depletion channel layer.

Further, Patent Document 2 (JP-S60-136262A) proposed a technology of restricting leakage photocurrent from being generated by making a semiconductor film of a TFT thinner.

Furthermore, Patent Document 3 (JP-2007-88432A) disclosed a problem in that upon making the semiconductor film of the TFT thinner, the semiconductor film on the bottom of a contact hole is removed by over-etching, so that contact resistance between an interconnection in the hole and a source/drain region increases. To solve this problem, a technology was proposed that the concentration of impurity elements is varied according to a depth of the impurity elements, while the degree of etching (depth) is controlled according to the concentration of the impurity elements.

DISCLOSURE OF THE INVENTION

However, while the technology of Patent Document 1, which uses a quarts substrate as a supporting substrate, can employ a high temperature process capable of fabricating a high performance TFT, a problem arises in that the process cost increases because the quarts substrate is expensive. Generally, the related art employs a low temperature process using a cheap glass substrate.

The technology of Patent Document 2 restricts leakage photocurrent from being generated by thinning the semiconductor film. However, a problem arises in that because in the low temperature process, an amorphous semiconductor formed by implanting impurity elements cannot be efficiently recovered, resistance in the source/drain region is high and therefore power consumption increases. In addition, since Patent Document 2 adopts a single drain structure, a problem arises in that even under dark condition, the leakage photocurrent is greatly generated, despite the leakage photocurrent being reduced under bright illumination condition, which the invention aims at.

Patent Document 3 can restrict the contact resistance between the interconnection and the source/drain region from increasing under the control of the degree of etching when the contact hole coming into contact with the source/drain region is formed. However, the technology presupposes that resistance in the source/drain region should be lower, and therefore a problem arises in that even if the technology is adapted to the semiconductor apparatus to be manufactured by a low temperature process as it is, the resistance in the source/drain region itself cannot be reduced.

The above-mentioned problems occurring in the related art will be described later in detail, along with the examination thereof.

The present invention is directed to provide a semiconductor device capable of restricting leakage photocurrent, a method of manufacturing the same, and a liquid crystal display device and an electronic apparatus having the same.

In accordance with an exemplary embodiment, there is provided a semiconductor device including: a supporting substrate; a semiconductor film on the supporting substrate; a gate insulating film on the semiconductor film; a gate electrode on the gate insulating film; and a source region and a drain region formed by introducing impurity elements to the semiconductor film. The thickness of the semiconductor film is within the range of 20 nm to 40 nm. Low-concentration regions are provided between the source region and a channel forming region, and between the drain region and the channel forming region, respectively. The low-concentration regions each have an impurity concentration smaller than that of the source region and that of the drain region, and the impurity concentration in a lower surface side region on the side of the supporting substrate is smaller than that of an upper surface side region on the opposite side.

In accordance with an exemplary embodiment, there is provided a method of manufacturing a semiconductor device, the method including: forming a semiconductor film on a supporting substrate, the semiconductor film having a thickness in a range of 20 nm to 40 nm; forming a gate insulating film on the semiconductor film; forming a gate electrode on the gate insulating film; and forming, on the semiconductor film, a source region and a drain region, and low-concentration regions between the source region and a channel forming region, and between the drain region and the channel forming region, respectively. The low-concentration regions each have an impurity concentration smaller than that of the source region and that of the drain region, and the impurity concentration in a lower surface side region on the side of the supporting substrate is smaller than that of an upper surface side region on the opposite side.

In accordance with an exemplary embodiment, there is provided a liquid crystal display device including: a liquid crystal panel including a semiconductor device; and a light source illuminating the liquid crystal panel. The semiconductor device includes: a supporting substrate; a semiconductor film on the supporting substrate; a gate insulating film on the semiconductor film; a gate electrode on the gate insulating film; and a source region and a drain region formed by introducing impurity elements to the semiconductor film. The semiconductor film is configured such that the integral of product A×B over the total wavelength range (nm) is not more than 5, where A is a relative intensity spectrum obtained by normalizing a luminescence spectrum of the light source by the maximum value of the luminescence spectrum, and B is a relative intensity spectrum obtained by normalizing an absorption spectrum of the semiconductor film by the maximum value of the absorption spectrum.

In accordance with an exemplary embodiment, there is provided a liquid crystal display device including: a liquid crystal panel including a semiconductor device; and a light source illuminating the liquid crystal panel. The semiconductor device includes: a supporting substrate; a semiconductor film on the supporting substrate; a gate insulating film on the semiconductor film; a gate electrode on the gate insulating film; and a source region and a drain region formed by introducing impurity elements to the semiconductor film. The thickness of the semiconductor film is within the range of 20 nm to 40 nm. Low-concentration regions are provided between the source region and a channel forming region, and between the drain region and the channel forming region, respectively. The low-concentration regions each have an impurity concentration smaller than that of the source region and that of the drain region, and the impurity concentration in a lower surface side region on the side of the supporting substrate is smaller than that of an upper surface side region on the opposite side.

In accordance with an exemplary embodiment, there is provided an electronic apparatus including the semiconductor device.

In accordance with an exemplary embodiment, there is provided an electronic apparatus including any one of the liquid crystal devices.

According to the exemplary embodiments, it is possible to provide the semiconductor device capable of restricting leakage photocurrent, the method of manufacturing the same, and the liquid crystal display device and the electronic apparatus having the same.

BEST MODE FOR CARRYING OUT THE INVENTION

Preferable exemplary embodiments will now be described.

First Exemplary Embodiment

Figure 1:
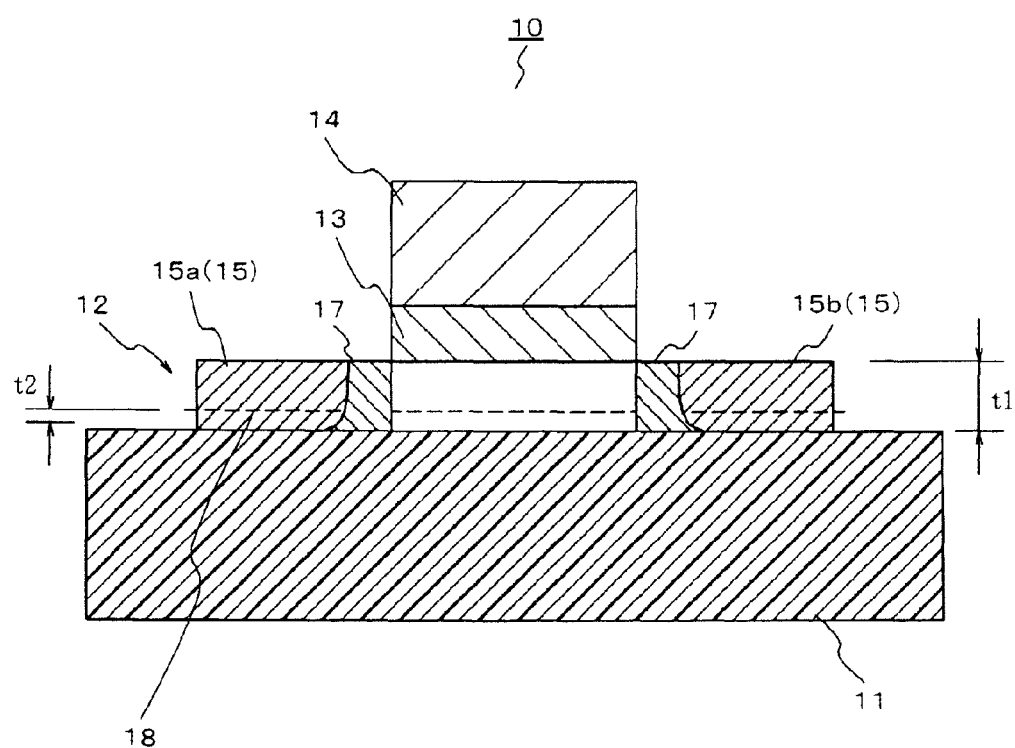
FIG. 1 is a schematic cross-sectional view illustrative of a semiconductor device according to a first exemplary embodiment.

The first exemplary embodiment will now be described while examining the above-mentioned related technology. FIG. 1 is a view showing a sectional structure of semiconductor device (e.g. a thin film transistor, TFT) 10 which is formed on transparent supporting substrate 11 and to which the exemplary embodiment is adapted.

As supporting substrate 11, there may be a glass substrate such as alkali-free glass or the like. Meanwhile, a silicon oxide film, or a laminated film including a silicon nitride film and a silicon oxide film may be formed on supporting layer 11 as a base film.

TFT 10 is a planar type transistor which includes semiconductor film 12, gate insulating film 13, gate electrode 14, and source region 15a and drain region 15b, which are formed on both left and right sides of gate electrode 14.

Low-concentration regions 17 are formed between source region 15a and a channel forming region and between drain region 15b and the channel forming region, respectively. The low-concentration region has an impurity concentration that is smaller than that of source region 15a and that of drain region 15b. Source region 15a and drain region 15b will be hereinafter referred to as high-concentration region 15 as a general term. The channel forming region is a region where a channel is formed in semiconductor film 12 below gate electrode 14 when the semiconductor device operates.

Semiconductor film 12 is formed by patterning polycrystalline silicon that is formed on supporting substrate 11. On semiconductor film 12, gate insulating film 13 and gate electrode 14 are formed. Further, with ion-implantation of impurity elements into semiconductor film 12, high-concentration region 15 and low-concentration region 17 are formed.

The semiconductor film is damaged by the implantation of impurity elements, and the crystalline phase thereof becomes amorphous. Such a phenomenon remarkably appears on the thin semiconductor film (polycrystalline silicon film) that Patent Document 2 proposed.

In Patent Document 2, the single drain structure is adopted so that leakage current flows through a grain boundary of the polycrystalline silicon film by high electric field applied to a drain side end. While this leakage current increases with light irradiation, original leakage current that flows in a dark state has a high value. Because of this, if high luminance is required, or if storage capacitance is reduced by making the LCD device have a high-resolution structure, it is needed to reduce the original dark-state leakage current.

Since it is not enough for impurity elements to exert their own function even if they are implanted, the impurity elements are treated with annealing for activating the impurity elements after the implantation.

As described in Patent Document 1, in case that the transistor is formed on the quartz substrate as a supporting substrate, a high temperature process of up to approximately 1150° C. may be adapted.

However, in case of a product such as a liquid crystal display device which is greatly required to reduce the product cost, a glass substrate such as cheap, alkali-free glass, soda lime glass or the like is used as a supporting substrate. The liquid crystal display device can be obtained at a low cost by using the cheap glass substrate. Since the glass substrate is softened at approximately 600° C., it needs to be processed in a low temperature process having a process temperature that is below the softening temperature.

Generally, the process temperature is connected with the degree of activation of impurity implants and further the sheet resistance. If we let the mobility and degree of activation of impurity implants be $\mu$ and x, respectively, in a low temperature process in which the product of n and x is in the order of about $10^{-1}$ to $10^{0}$, unlike the high temperature process of Patent Document 1 in which the product of $\mu$ and x is larger than that of the low temperature process, the impurity implants cannot be sufficiently activated, so that resistance in high-concentration region 15 cannot be reduced. If the resistance in high-concentration region 15 is high, a problem occurs in that when current flows through the region, the great amount of power is consumed, and a signal from a data line cannot be accurately applied to a pixel electrode.

Meanwhile, the technology of Patent Document 3 controls the etching depth by selecting an etching condition and the concentration distribution of impurity implants in a depth direction of the semiconductor film. The technology is advantageous in that even when the thickness of the semiconductor film is small, it controls the etching depth according to the depth of the high-concentration region thereby to restrict the contact resistance between the interconnection and the high-concentration region from increasing. However, this technology does not directly contribute to a technical solution to adopt the low temperature process because it presupposes low resistance of high-concentration 15 and low concentration region 17.

Taking this into consideration, in order to obtain restriction of leakage photocurrent, an increase in breakdown voltage between a source region and a drain region, and low resistance of high-concentration 15 and low concentration region 17, the exemplary embodiment may include at least configurations B and D among following configurations A to E. Further, the exemplary embodiment may additionally include another configuration solely or other configurations in a combined form according to desired characteristics.

Configuration A

The configuration A is to use a light element, such as boron, as an impurity element. By using such a light impurity element, the amount of crystalline defects is reduced upon implantation of impurity element.

Configuration B

The configuration B is to make the thickness (t1) of the semiconductor film have a range of 20 nm to 40 nm. Upon incidence of light upon the semiconductor film, if the volume of semiconductor film 12 is made smaller (i.e. is made thinner), light-receiving volume decreases and accordingly the number of excited carriers are reduced thereby to restrict leakage photocurrent from occurring.

Figure 2:
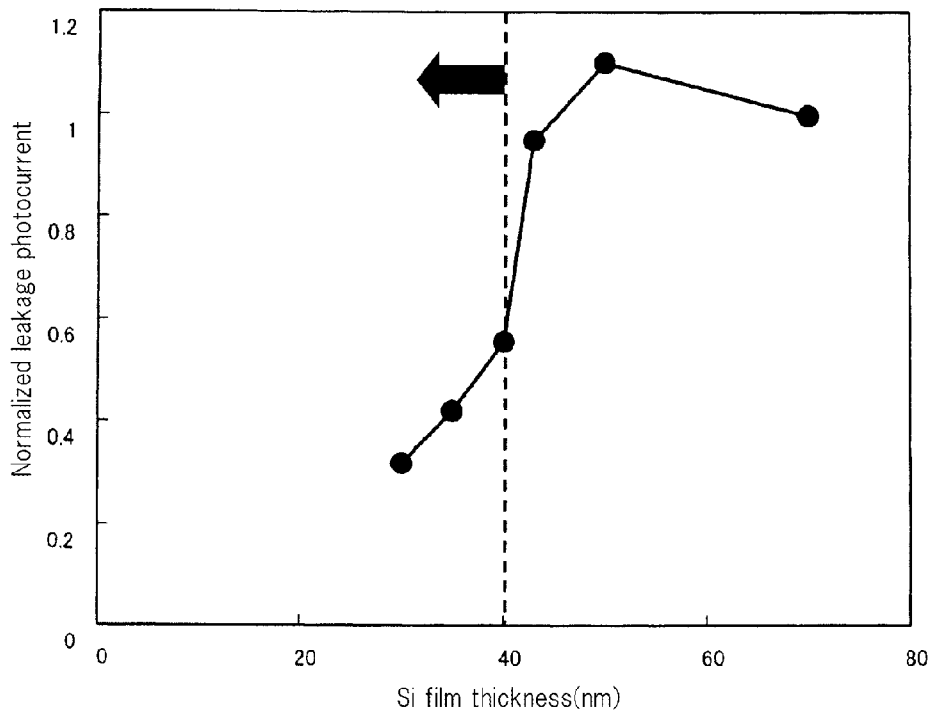
FIG. 2 is a graphical diagram illustrative of the correlation between the thickness of a semiconductor film (Si) and normalized leakage photocurrent.

FIG. 2 shows the correlation between the thickness and a value of normalized leakage photocurrent of the semiconductor film when using silicon as semiconductor film 12. Meanwhile, the value of normalized leakage photocurrent is a value of leakage photocurrent that is normalized for the respective film thickness based on the value of leakage photocurrent at the film thickness of 70 nm as a reference. As can be seen from FIG. 2, the value of normalized leakage photocurrent is sharply reduced at the film thickness of 40 nm or less. Thus, it can be concluded that an upper limit of the thickness of semiconductor film 12 may amount to 40 nm or less, preferably. Meanwhile, a lower limit (20 nm) of the film thickness is drawn from sheet resistance as will be described later in detail with reference to configuration E.

Configuration C

The configuration C is presented so that an impurity concentration in a region, having a certain depth range, of high-concentration region 15 on the side of supporting substrate 11, i.e. in a region having a certain range in the thickness direction from a boundary surface of semiconductor film 12 on the side of supporting substrate 11, is made to have 3.4× $10^{20}$ cm$^{-3}$ or less. Hereinafter, the region having the certain depth range from the side of the supporting substrate will be referred to as near-substrate region 18 (see FIG. 1). In this case, if a base film is presented between supporting substrate 11 and semiconductor film 12, the near-substrate region means a region having a certain range directed in the depth direction from a boundary surface between the base film and semiconductor film 12. The thickness (t2) of near-substrate region 18 may be preferably 0.6 nm or more, more preferably about 1 nm or more. The thickness (t2) of the near-substrate region may be preferably ¼ or less times the thickness (t1) of semiconductor film 12.

Since high-concentration region 15 is formed by implanting an impurity element in a high-concentration, the degree of amorphization is high. However, in the low temperature process, the amorphous semiconductor cannot be easily recrystallized.

Figure 3:
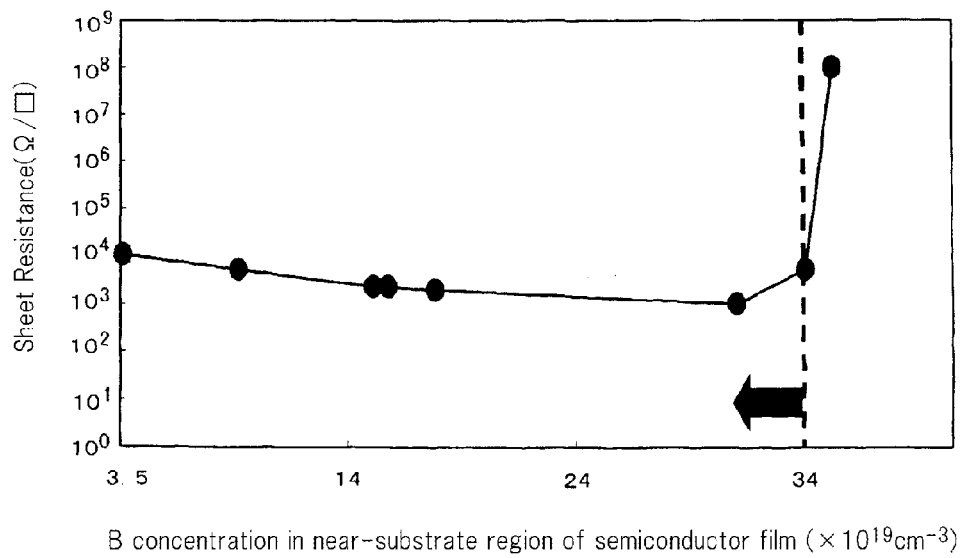
FIG. 3 is a graphical diagram illustrative of the correlation between an impurity (B) concentration and sheet resistance in a region near a substrate in the semiconductor film.

FIG. 3 shows the correlation between the impurity concentration (of boron) in near-substrate region 18 and sheet resistance on that point when the film thickness of semiconductor film 12 is 40 nm.

If the impurity concentration exceeds $3.4 \times 10^{20}$ cm$^{-3}$, amorphization of near-substrate region 18 is performed, but the recovery from an amorphous phase to a crystalline phase is not sufficiently conducted, so that sheet resistance greatly increases. Meanwhile, if the impurity concentration is not more than $3.4 \times 10^{20}$ cm$^{-3}$, the sheet resistance greatly decreases.

Meanwhile, if phosphor that is heavier than boron is used as an impurity element, since a solubility limit of phosphor into silicon is small, the sheet resistance increases. Thus, it is preferred that an implant for near-substrate region 18 of semiconductor film 12 be phosphor and the concentration thereof amount to $3.4 \times 10^{20}$ cm$^{-3}$ or less. Actually, the impurity concentration may be set to $3 \times 10^{20}$ cm$^{-3}$ or less.

Therefore, by making the impurity concentration in near-substrate region 18 have $3.4 \times 10^{20}$ cm$^{-3}$ or less, the degree of amorphization of the semiconductor in near-substrate region 18 by implantation of impurity can be reduced. That is, a semiconductor having a crystalline phase that is not amorphized remains.

Accordingly, even in a low temperature activation annealing, a crystalline semiconductor becomes the nucleus for crystal growth, so that amorphized semiconductor is easily crystallized. The crystallization allows the impurity to be received on the side of silicon and not to function as a precipitating dispersion, thereby obtaining a low resistance.

Meanwhile, in order to obtain a sufficient effect of adding an impurity, the impurity concentration of high-concentration region 15 may be preferably $3.1 \times 10^{18}$ cm$^{-3}$ or more. Actually, the impurity concentration may be set to $4 \times 10^{18}$ cm$^{-3}$ or more.

Configuration D

The configuration D is to provide low-concentration region 17. Reduction in breakdown voltage between source and drain becomes noticeable when semiconductor film 12 is made thinner. If breakdown voltage between source and drain becomes lower, OFF current increases.

The fact that noticeable reduction in breakdown voltage between source and drain occurs when the thickness (t1) of semiconductor film 12 is made thinner was newly found by the inventors. While the theoretical background is unclear, the inventors assume that the phenomenon is caused from extension of drain current distribution in a thickness direction when TFT 10 is pinched off. That is, if the thickness (t1) of semiconductor film 12 is made thicker, a depletion layer of a drain region upon pinch-off may be widen in the thickness direction, which makes it difficult for electric field concentration to occur. On the contrary, if the thickness (t1) of semiconductor film 12 is made thinner, the depletion layer is not sufficiently extended in the thickness direction, so that it is assumed that electric field concentration occurs and thus the breakdown voltage reduces.

Thus, low-concentration region 17 is formed between a channel and high-concentration region 15. It is preferred that low-concentration region 17 is configured to have concentration distribution in a thickness direction such that the impurity concentration of a near-boundary portion (near a lower surface of the semiconductor film) on the side of the supporting substrate is made smaller than that of a near-boundary portion (near an upper surface of the semiconductor film) on the side of the gate insulating film, thereby resistance of the near-boundary portion on the side of the supporting substrate being higher than that of the near-boundary portion on the side of the gate insulating film. On the contrary, if the resistance on the side of the supporting substrate is lower than that on the side of the gate insulating film, current flow is formed near the boundary on the side of the supporting substrate. When making higher the resistance of the near-boundary portion on the side of the supporting substrate as such, it is difficult to form current flow near the boundary on the side of the supporting substrate.

Meanwhile, upon light incidence from the side of supporting substrate, photo-carriers are generated by photo excitation. According to photo-absorption characteristics of a semiconductor film, the photo-carriers are generated furthermore on the side of an incidence face. Here, if the current flow is formed near the boundary on the side of gate insulating film as such, the photo-carriers, that are created on the side of incidence face, i.e. the near-boundary portion on the side of supporting substrate, are restricted from being transported, so that it is possible to restrict whole leakage photocurrent in a thickness direction.

Figure 4:
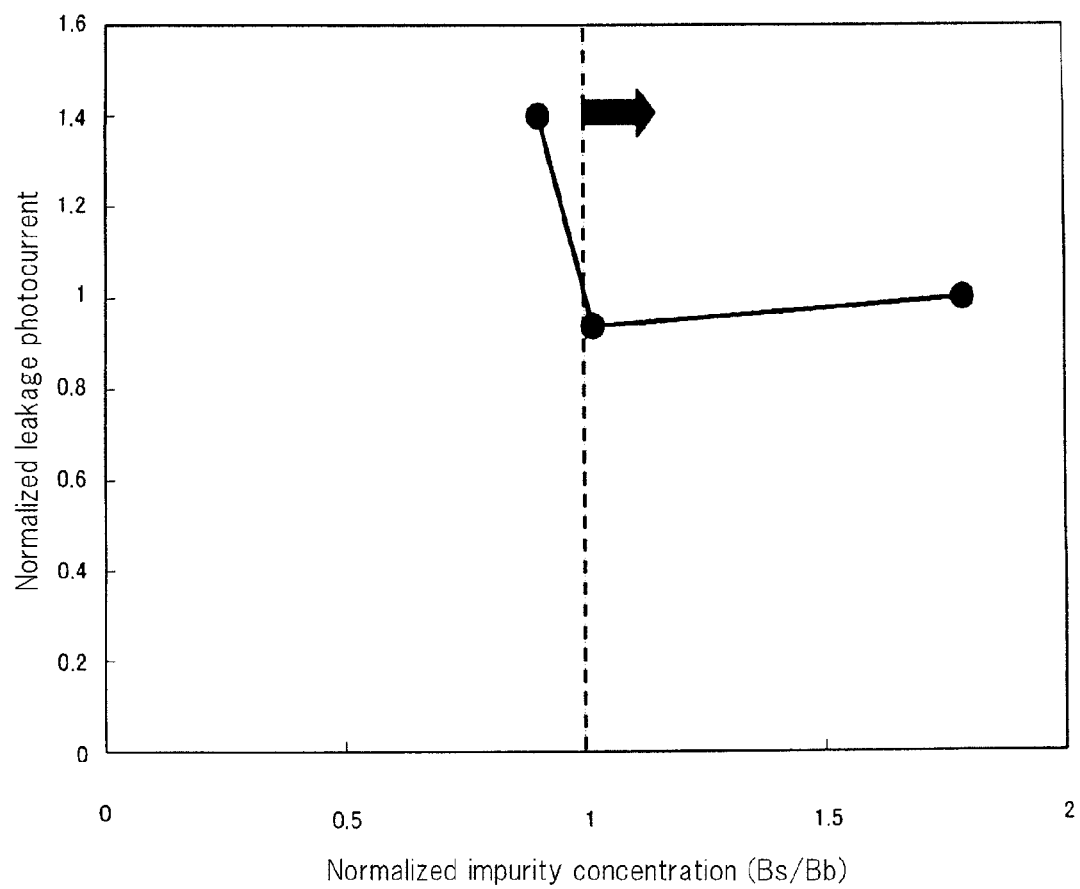
FIG. 4 is a graphical diagram illustrative of the correlation between a ratio (Bs/Bb) of an impurity concentration of a near-surface region to that of a near-substrate region and normalized leakage photocurrent in a low-concentration region of the semiconductor film.

FIG. 4 shows the correlation between a ratio of impurity concentrations of a near-upper surface region and a near-lower surface region (near-boundary portion on the side of the substrate) in the low-concentration region of semiconductor film 12 of a TFT, and normalized leakage photocurrent. Here, the TFT is configured so that the thickness of semiconductor film 12 has a range of 20 nm to 40 nm, and the impurity concentration of near-substrate region 18 amounts to $3.4 \times 10^{20}$ cm$^{-3}$ or less. The axis of abscissa indicates normalized impurity concentration (Bs/Bb) where Bs is the impurity concentration of the near-upper surface region (a region ranging 0 to 4 nm from an upper surface) in the low-concentration region of semiconductor film 12, and Bb is the impurity concentration of the near-lower surface region (a region ranging 0 to 4 nm from a lower surface) in the low-concentration region of the semiconductor film. The axis of ordinates indicates normalized leakage current [Ip/Ip(1.79)] that is obtained by normalizing leakage photocurrent Ip by leakage photocurrent Ip(1.79) when the normalized impurity concentration (Bs/Bb) is 1.79.

If the normalized impurity concentration (Bs/Bb) becomes larger than 1, leakage photocurrent sharply decreases. Thus, the normalized impurity concentration (Bs/Bb) is made larger than 1. That is, it is preferred that in low-concentration region 17, the impurity concentration of the near-boundary portion on the side of the substrate (the near-lower surface region of the semiconductor film) is lower than that of the near-upper surface region.

Configuration E

The configuration E is to make sheet resistance of low-concentration region 17 have a range of $3 \times 10^5 \Omega/\square$ to $2 \times 10^7 \Omega/\square$.

If semiconductor film 12 is a polycrystalline silicon film, a grain boundary exists in the polycrystalline silicon film. Then, because of unevenness of defects in the grain boundary, OFF current of the TFT becomes uneven. Thus, in case that in a liquid crystal display device, precise display is required, and a charge storage capacitance for sustaining an electric potential of a pixel electrode is low, variation of charges sustained becomes remarkable due to the unevenness of OFF current of the TFT, resulting in occurrence of unevenness in an image quality.

Figure 5:
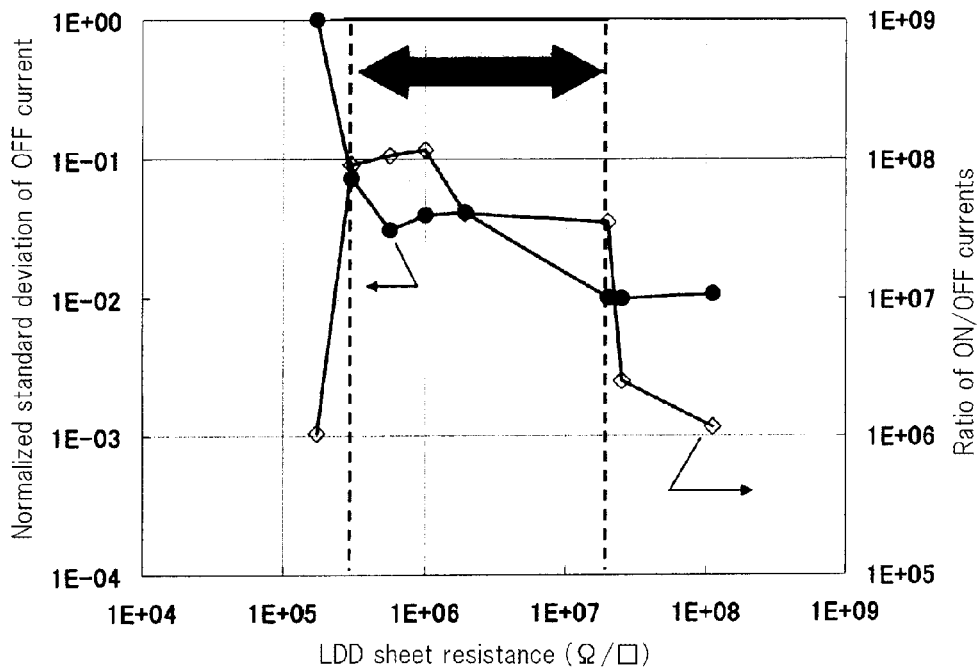
FIG. 5 is a graphical diagram illustrative of the correlation between sheet resistance of a low-concentration region (LDD region) of the semiconductor film, the standard deviation of normalized OFF current of a TFT, and a ratio of ON/OFF currents.

FIG. 5 shows the correlation between sheet resistance of the low-concentration region of the semiconductor film, the normalized standard deviation of OFF current of a TFT, and a ratio of ON/OFF currents. Here, the normalized standard deviation is a value that is normalized by the highest standard deviation within the measurements shown in FIG. 5, and serves as an index to indicate the degree of unevenness of a TFT product. It can be known from FIG. 5 that the normalized standard deviation of OFF current can be sufficiently restricted by making the sheet resistance of the low-concentration region have $3 \times 10^5 \Omega/\square$ or more. Further, it can also be known from FIG. 5 that if the sheet resistance is high and exceeds $2 \times 10^6 \Omega/\square$, more favorable evenness can be obtained.

Meanwhile, because ON current decreases as sheet resistance of the low-concentration region increases, the ratio of ON/OFF currents becomes lower, so that an image quality of a liquid crystal display device deteriorates remarkably. It can be known from FIG. 5 that in order to secure minimum ON current required to write a signal to a pixel, and a proper ratio of ON/OFF currents, it is preferred to make the sheet resistance of the low-concentration region have $2 \times 10^7 \Omega/\square$ or less.

From the foregoing, the sheet resistance of low-concentration region is made to have a range of $3 \times 10^5 \Omega/\square$ to $2 \times 10^7 \Omega/\square$, so that a semiconductor device in which unevenness of OFF current is sufficiently restricted can be obtained.

It is more preferable that the sheet resistance of low-concentration region 17 is made to have a range of $3 \times 10^5 \Omega/\square$ to $1 \times 10^6 \Omega/\square$. There may be a case where sufficiently high ON current is required in a TFT that needs a driving capability in a peripheral drive circuit or the like. However, if ON current of a TFT increases, OFF current also increases, with regard to the sheet resistance of low-concentration region 17. Hence, a condition that OFF current is restricted while ON current increases is required.

Figure 6:
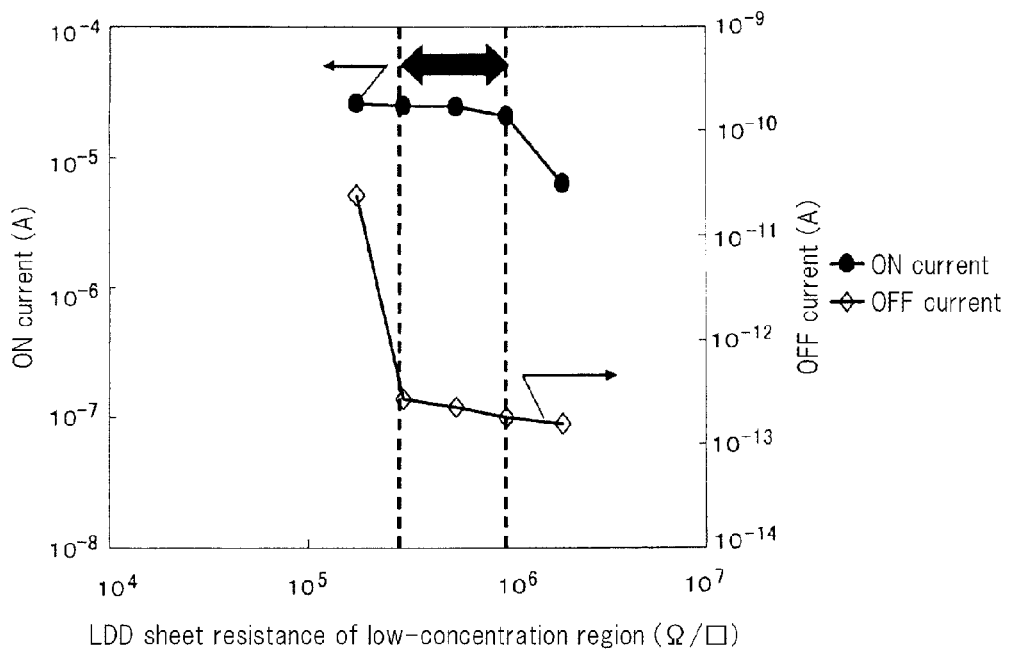
FIG. 6 is a graphical diagram illustrative of the correlation between the sheet resistance of LDD region, ON current, and OFF current.

FIG. 6 shows the correlation between the sheet resistance of low-concentration region 17, and ON current or OFF current. As can be seen from this figure, such a condition can be satisfied by setting the sheet resistance of low-concentration region 17 to a range of $3 \times 10^5 \Omega/\square$ to $1 \times 10^6 \Omega/\square$, thereby sufficiently restricting OFF current while obtaining sufficiently high ON current.

Figure 7:
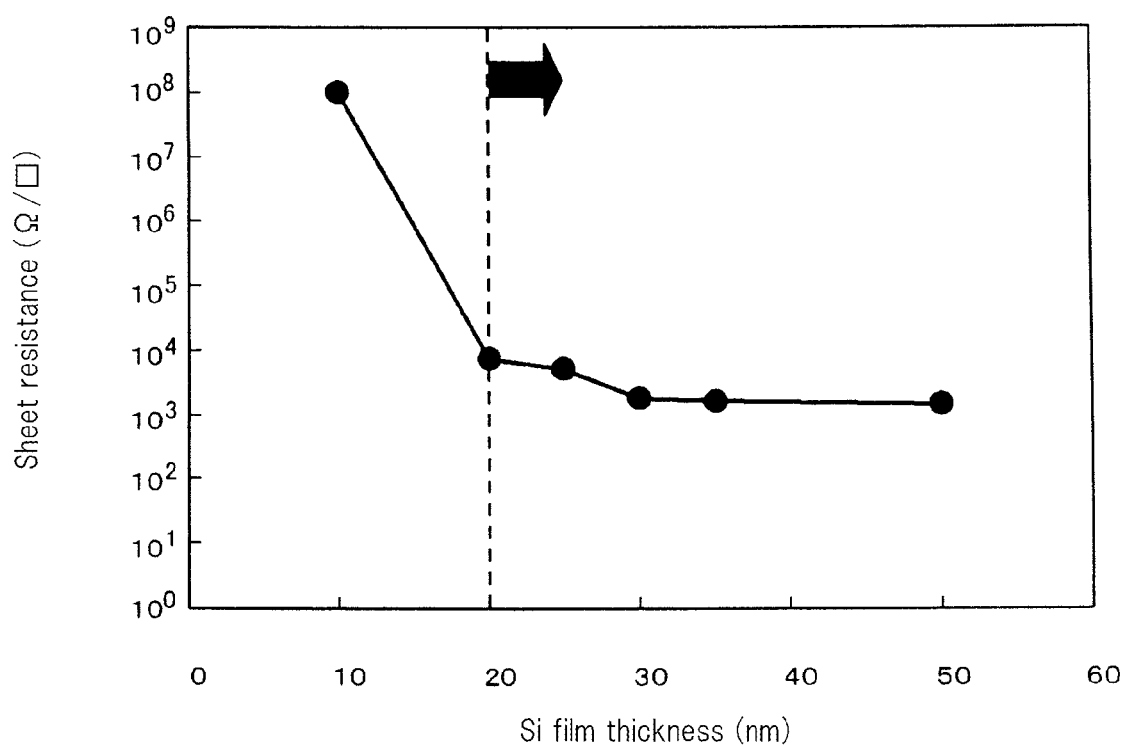
FIG. 7 is a graphical diagram illustrative of the correlation between the thickness of a semiconductor film and the sheet resistance of LDD region.

FIG. 7 shows the correlation between the thickness of semiconductor film 12 and the sheet resistance of low-concentration region 17. The figure indicates the sheet resistance of low-concentration region 17, into which boron is implanted, in TFT 10 having semiconductor film 12, a thickness of which varies. As can be seen from FIG. 7, as the thickness of semiconductor film 12 becomes thinner than 20 nm, the sheet resistance greatly increases. This is because as the thickness decreases, the solid-soluble amount of boron in semiconductor film 12 decreases. Thus, it is difficult to make the sheet resistance lower in a film thickness thinner than 20 nm.

That is, in order to lower the sheet resistance, it is required that the thickness of semiconductor film 12 amounts to 20 nm or more. The thickness may also be set to 25 nm or more. In combination with the above-described matter that the thickness of semiconductor film 12 is set to 40 nm or less in configuration B, it is thus concluded that the thickness of semiconductor film 12 amounts to a range of 20 nm to 40 nm, preferably.

Therefore, there can be provided a semiconductor device in which breakdown voltage between source/drain is high and leakage photocurrent is sufficiently restricted.

However, characteristics required for a TFT used with a pixel and for a TFT constituting a peripheral drive circuit are generally different. For example, as described before, the TFT of pixel requires wide range evenness in order to restrict unevenness of display. Meanwhile, the TFT used in the peripheral drive circuit requires a higher driving capability because there exists a demand for reducing the occupied area of the peripheral drive circuit as smaller as possible in order to narrower a width of a frame of a liquid crystal display device. Thus, as described before, it is possible to obtain the evenness of a pixel region by making the sheet resistance of the low-concentration region have a range of $3 \times 10^5 \Omega/\square$ to $2 \times 10^7 \Omega/\square$. Further, in case of the TFT in a peripheral drive circuit or the like that requires a high driving capability, it is possible to satisfy the demand for obtaining sufficiently high ON current by making the sheet resistance of the low-concentration region have a range of $3 \times 10^5 \Omega/\square$ to $1 \times 10^6 \Omega/\square$. Therefore, there can be obtained a liquid crystal display device in which the unevenness of display is restricted and an out of display section (so called a frame) is small, and which can contribute to high quality display and miniaturization of electronic appliances such as mobile phones or note PCs. According to this exemplary embodiment, a TFT suitable for such a liquid crystal display device can be provided.

Second Exemplary Embodiment

Figure 9:
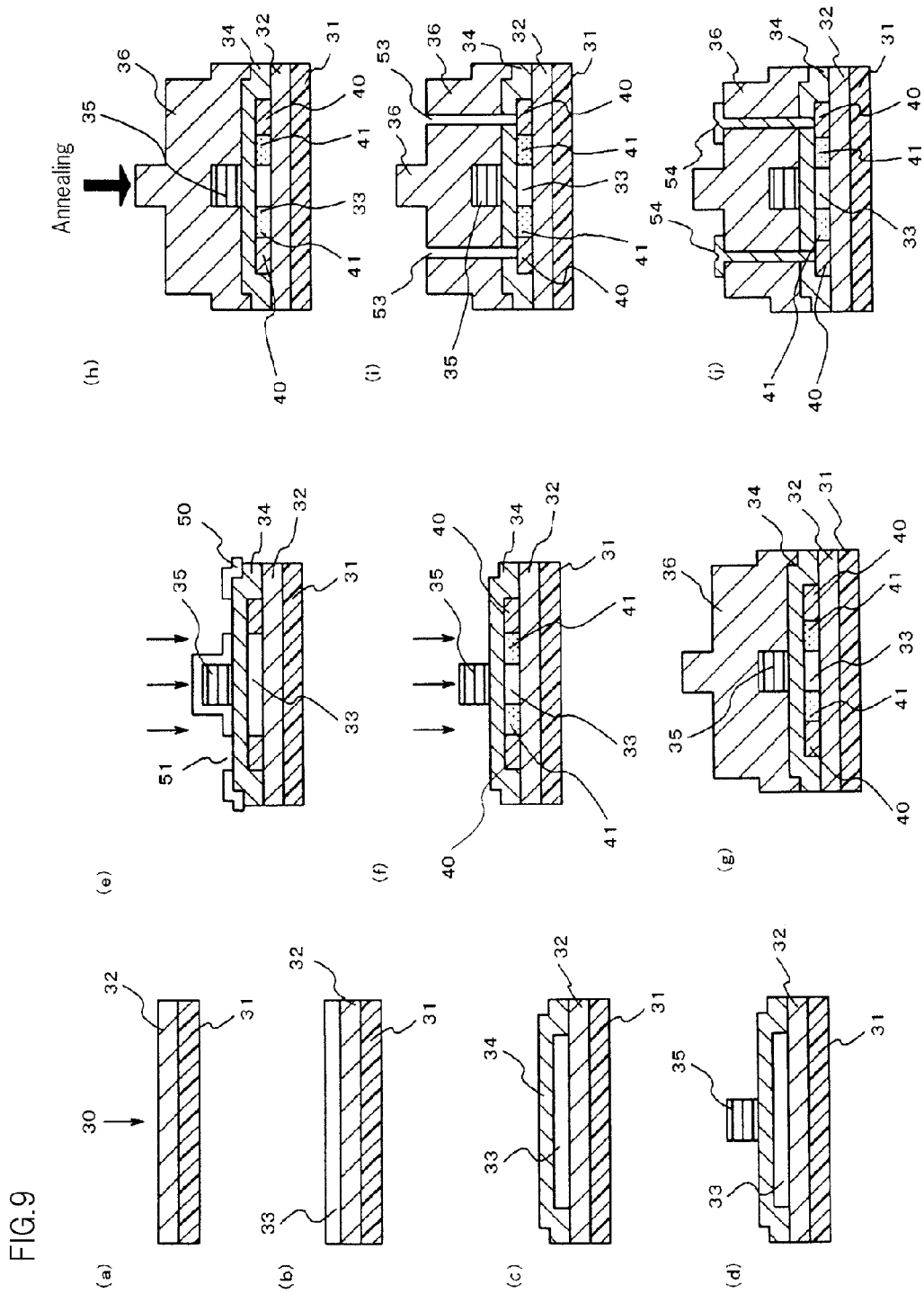
FIG. 9 is a process diagram illustrative of an exemplary procedure of a method of manufacturing the semiconductor device of the second exemplary embodiment.
Figure 10:
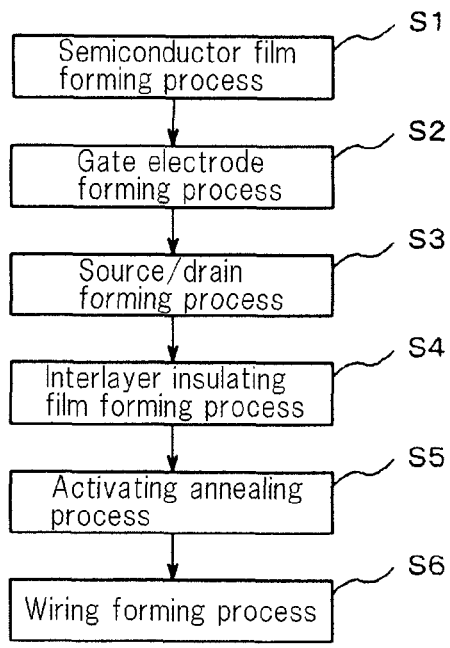
FIG. 10 is a flow chart illustrative of a procedure of the method of FIG. 9.

A second exemplary embodiment will now be described with reference to FIGS. 8 to 10.

Figure 8:
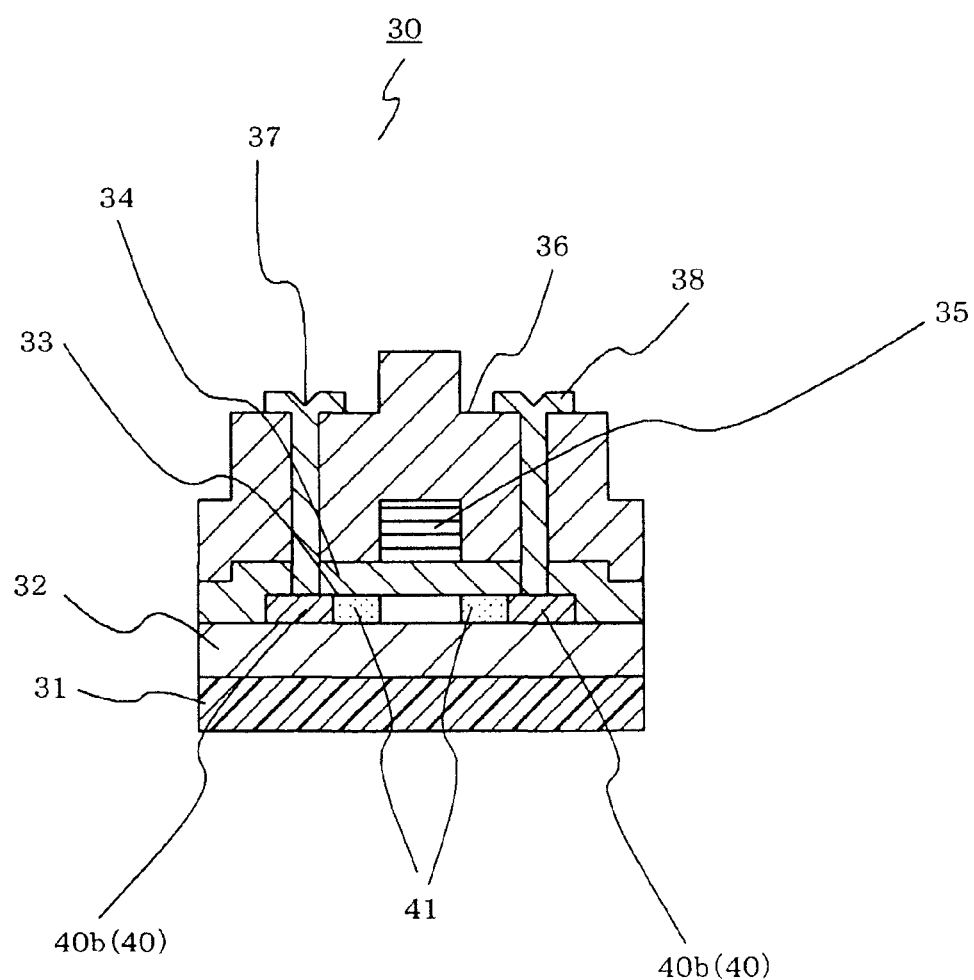
FIG. 8 is a cross-sectional view illustrative of a semiconductor device according to a second exemplary embodiment.

FIG. 8 shows a sectional structure of semiconductor device 30 according to the second exemplary embodiment. FIG. 9 is a process diagram illustrative of an exemplary procedure of a method of manufacturing semiconductor device 30, and FIG. 10 is a flow chart illustrative of the procedure of the method.

Semiconductor device (e.g. TFT) 30 includes base film 32, semiconductor film 33, gate insulating film 34, gate electrode 35, interlayer insulating film 36, source wiring 37, drain wiring 38, and the like, which are formed on supporting substrate 31.

In TFT 30, between high-concentration region 40 (including source region 40a and drain region 40b) and a channel end, low-concentration region 41 having a low impurity concentration is provided, thereby forming so called a lightly doped drain (LDD) structure. The impurity concentration of high-concentration region 40 has a range of $3.1 \times 10^{18}$ cm$^{-3}$ to $3.4 \times 10^{20}$ cm$^{-3}$. In addition, the sheet resistance of low-concentration region 41 is set to a range of $3 \times 10^5 \Omega/\square$ to $1 \times 10^6 \Omega/\square$.

The detailed construction of a TFT will be described, together with an exemplary manufacturing process. The manufacturing process generally includes 6 processes. Meanwhile, reference signs S1 to S2 that correspond to the respective processes indicate the respective steps of the flow chart of FIG. 10.

(1) Semiconductor Film Forming Process (S1)

First, base film 32 composed of a silicon oxide film or a laminated film including a silicon nitride film and a silicon oxide film is formed on supporting substrate 31 (see FIG. 9(a)). As supporting substrate 31, a cheap glass substrate such as alkali-free glass or the like is used.

An amorphous silicon film of approximately 40 nm is formed on base film 32 (see FIG. 9(b)). Here, for the purpose of controlling a threshold value of TFT 30, an impurity such as B or P is introduced in a dose of e.g. $1 \times 10^{16}$ cm$^{-3}$ during the film-forming process. Meanwhile, after forming the amorphous silicon film, an impurity may be introduced by means of ion-doping or ion-implanting.

Then, the amorphous silicon film is exposed to an excimer laser or the like, thereby forming a semiconductor film 33 of polycrystal silicon having an excellent semiconductor characteristic. Semiconductor film 33 is etched into a desired pattern by photolithography and a dry etching method.

(2) Gate Electrode Forming Process (S2)

After forming semiconductor film 33, gate insulating film 34 is formed (see FIG. 9(c)). Also, as a preprocessing of gate insulating film-forming process, semiconductor film 33 is processed to remove a natural oxide formed on the upper surface thereof using diluted hydrofluoric acid (DHF), thereby forming a clean silicon surface.

Gate insulating film 34 is formed at a temperature of below 600° C., which is lower than the temperature at which supporting substrate 31 is thermally deformed, by a plasma CVD method. The thickness of gate insulating film 34 amounts to, but not particularly limited to, for example a range of preferably 5 nm to 5000 nm, more preferably 10 nm to 1000 nm.

Then, a gate electrode film is formed on gate insulating film 34. The gate electrode film may be composed of a metal film obtained by a sputtering method, an impurity-contained silicon film obtained by a CVD method or the like, and a laminated film including the metal film and the silicon film. Here, the impurity may be e.g. B or P, and may be introduced while varying the concentration and kind of the impurity, in order to adjust a threshold value under the control of a work function of gate electrode 35 with respect to a channel and.

A photoresist pattern is formed on the gate electrode film using photolithography, and the gate electrode film is etched to form gate electrode 35 using a dry etching, a wet etching, or a combined etching method thereof (see FIG. 9(d)).

(3) Source Region and Drain Region Forming Process (S3)

High-concentration region 40 of a source region and a drain region is formed before low-concentration region 41 is formed. However, the forming process may vary in such a manner that low-concentration region 41 is first formed, and then a resist pattern is formed to cover gate electrode 35 and the low-concentration region, thereby forming high-concentration region 40. While this exemplary embodiment illustrates the case where forming of the drain and source regions is performed after gate electrode 35 is formed, the forming process may be conducted in such a manner that the source and drain regions are first formed, and then gate electrode 35 is formed.

Resist 50 is first applied onto the whole surface of the semiconductor film, and a resist pattern having opening 51 that corresponds to high-concentration region 40 is formed (see FIG. 9(e)). An impurity is implanted in a high concentration using the resist pattern as a mask, by means of an ion-doping or an ion-implantation. After implantation of impurity, the resist pattern is removed and the forming of high-concentration region 40 is completed.

In this process, the impurity may be B, preferably. Here, an acceleration voltage and a dose of impurity are regulated such that the impurity concentration of a near-substrate region amounts to a range of $3.1 \times 10^{18}$ cm$^{-3}$ to $3.4 \times 10^{20}$ cm$^{-3}$. In the case that the thickness of semiconductor film 12 is 40 nm, a silicon oxide film having a film thickness of 160 nm is formed thereon (on the gate insulating film-side), and then boron is implanted using an ion-doping, it may be illustrated a condition that an acceleration voltage is 25 keV, a dose is set to $6.7 \times 10^{15}$ cm$^{-2}$, and RF power is 100 W.

Then, low-concentration region 41 is formed. While implantation of an impurity for forming low-concentration region 41 is performed by means of a method similar to that of high-concentration region 40, the resist pattern is not used, and gate electrode 35 is used as a mask (see FIG. 9(f)).

Here, the acceleration voltage is set such that the impurity concentration of the surface of the semiconductor film on the side of gate electrode 35 becomes higher than that of an opposite surface (bottom surface) of the semiconductor film on the side of supporting substrate 12. Further, the dose is regulated such that the sheet resistance of low-concentration region 41, which has been processed with an activating annealing process, amounts to preferably $3 \times 10^5 \Omega/\square$ to $2 \times 10^7 \Omega/\square$, more preferably $3 \times 10^5 \Omega/\square$ to $1 \times 10^6 \Omega/\square$.

(4) Interlayer Insulating Film Forming Process (S4)

Next, interlayer insulating film 36 is formed. Interlayer insulating film 36 is provided by forming a silicon oxide film, a silicon nitride film or a laminated deposition film including the same using a plasma CVD process (see FIG. 9(g)).

(5) Activating Annealing Process (S5)

Next, an activating annealing process is performed to activate impurity implants (see FIG. 9(h)). The annealing temperature is set to a range of 300 to 600° C. The activating annealing process may be performed in an electric furnace or using a rapid annealing method such as an excimer laser.

(6) Wiring Forming Process (S6)

After the activating annealing process has been completed, contact hole 53 is formed in interlayer insulating film 36, and a wiring forming process is performed to form a gate wiring, a source wiring and a drain wiring (see FIG. 9(i) and FIG. 9(j)).

Contact hole 53 is formed by forming a resist pattern, which has openings corresponding to a gate, a source, and a drain, on interlayer insulating film 36, and etching interlayer insulating film 36 using a dry etching, a wet etching or a combined etching thereof. After forming contact hole 53, a metal film such as an aluminum film is formed using a sputtering method or the like, and the metal film is etched to form wiring 54, using diverse kinds of etching methods and lithography.

In addition, it is preferred that a process for terminating a dangling-bond that is provided in semiconductor film 33 or on a boundary between semiconductor film 33 and gate insulating film 34 is performed to stabilize an electric characteristic. An element for termination may be e.g. hydrogen. The termination process may be a hydrogen plasma process. Such a process may be performed at any stages only after gate insulating film 34 has been formed.

From the foregoing processes, a main procedure of manufacturing TFT 10 is completed. In the case that the gate wiring and the source wiring or the drain wiring intersects (for instance, in the case that TFT 10 is adapted to an active matrix liquid crystal display device), in order to separately arrange intersecting wirings, it is possible to perform the wiring forming process while dividing the wiring forming process into two sub-processes.

According to the manufacturing method, with only setting of a manufacturing condition, a semiconductor device in which the sheet resistance of the low-concentration region is low, the breakdown voltage between source and drain is high, and leakage photocurrent is sufficiently restricted can be manufactured without needing certain specialized processes compared to the related art while maintaining compatibility of processes with the related art.

Third Exemplary Embodiment

A third exemplary embodiment will now be described in detail with reference to the drawings. Aforementioned exemplary embodiments are to perform an operation of restricting leakage photocurrent in connection with the structure of the semiconductor device such as TFT 10. Leakage photocurrent is generated by carriers photo-excited by incident rays of light. The photoexcitation is a phenomenon that carriers which absorbed the energy of incident rays of light are excited in an energy band. Thus, by reducing the degree of absorption, it is possible to reduce leakage photocurrent even if crystal defects of the same quantity exist.

Thus, this exemplary embodiment restricts leakage photocurrent by defining the relationship between a luminescence spectrum of a light source and an absorption spectrum of a semiconductor.

Figure 11:
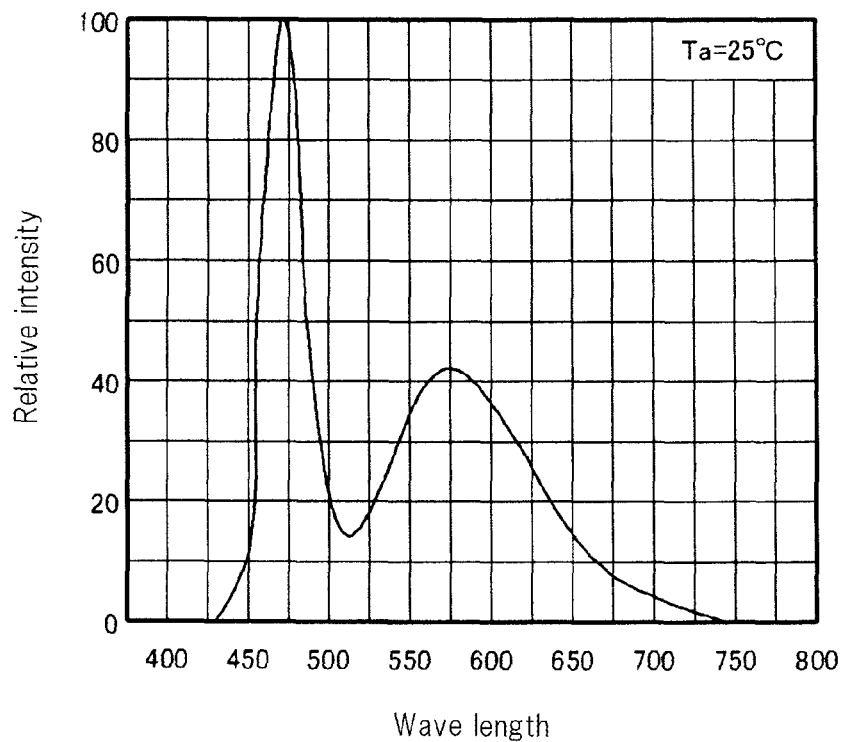
FIG. 11 is a diagram illustrative of a relative intensity spectrum of a light-emitting diode.
Figure 12:
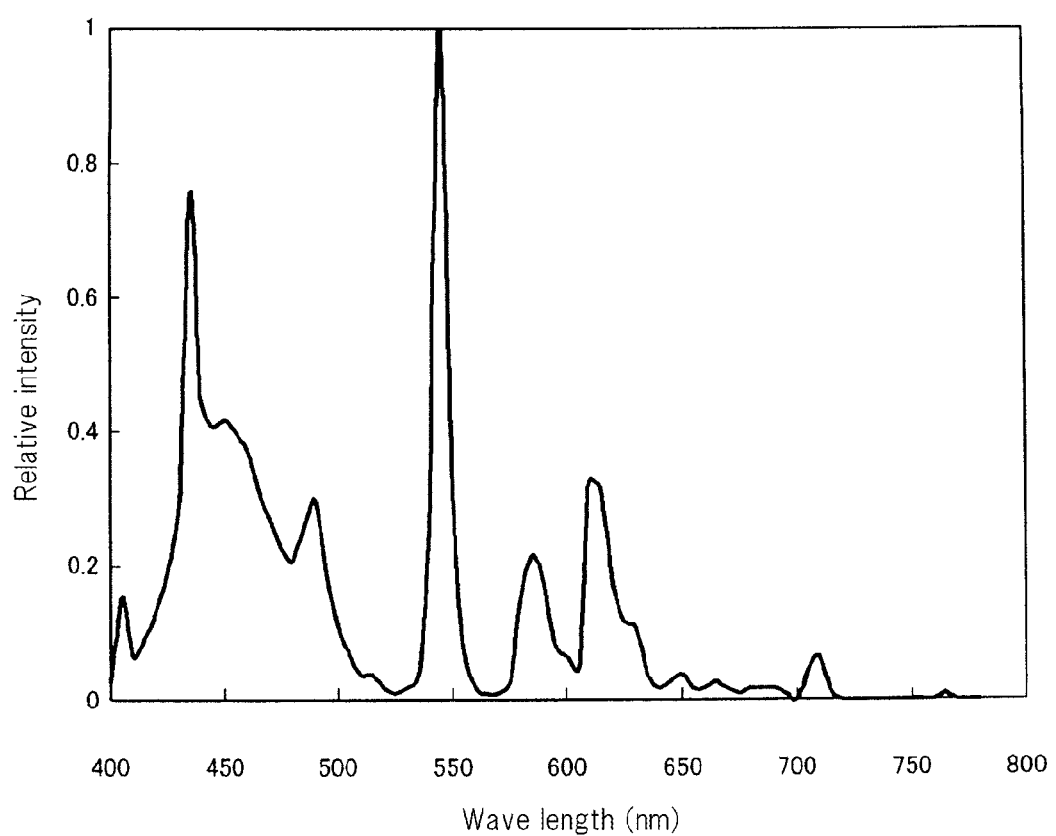
FIG. 12 is a diagram illustrative of a relative intensity spectrum of a cold cathode fluorescent lamp.

FIG. 11 shows a relative intensity spectrum of a luminescence spectrum of a white light-emitting diode (LED) when a maximum value is set to 100, FIG. 12 shows a relative intensity spectrum of a cold cathode fluorescent lamp (CCFL) when a maximum value is set to 1. Like this, the luminescence spectrum is different according to a light source. The axis of ordinates indicates a relative value of luminescence intensity.

Figure 13:
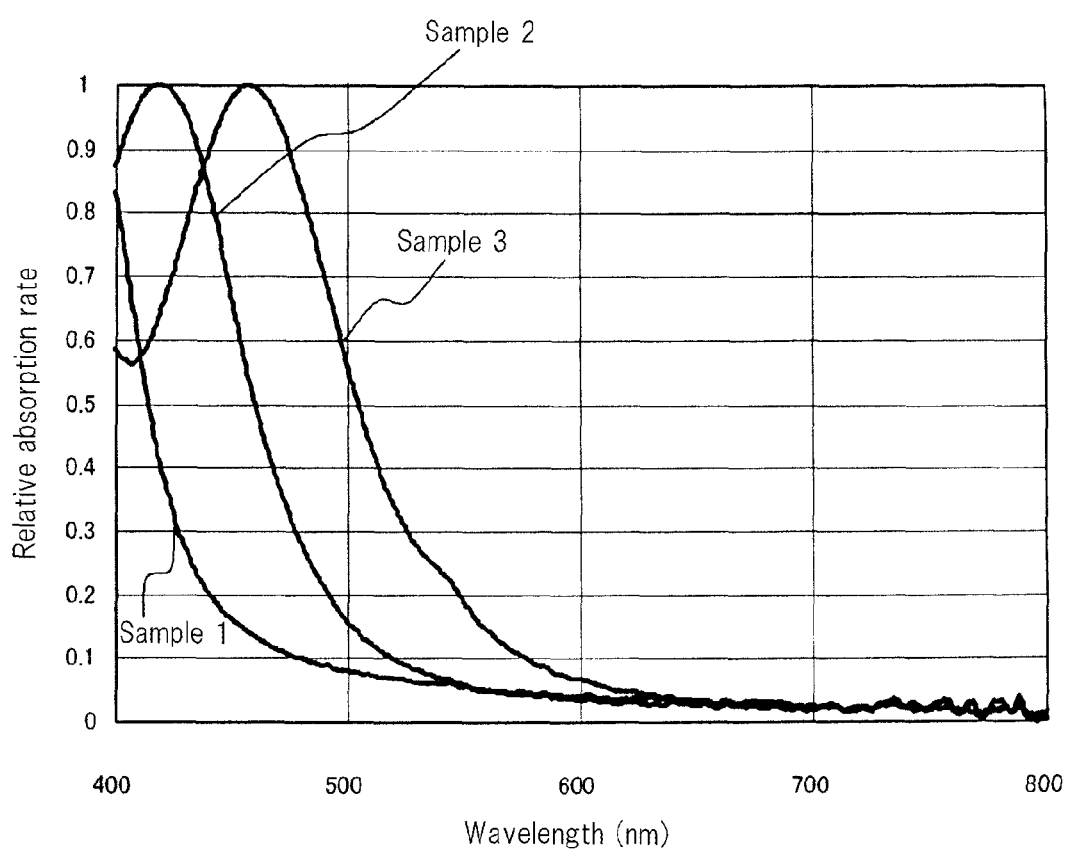
FIG. 13 is a diagram illustrative of a relative intensity spectrum of three kinds of semiconductor films.

FIG. 13 shows a relative intensity spectrum of an absorption spectrum of three kinds of silicon films having different thicknesses when a maximum value is set to 1. The axis of ordinates indicates a relative value of an absorption rate.

Figure 14:
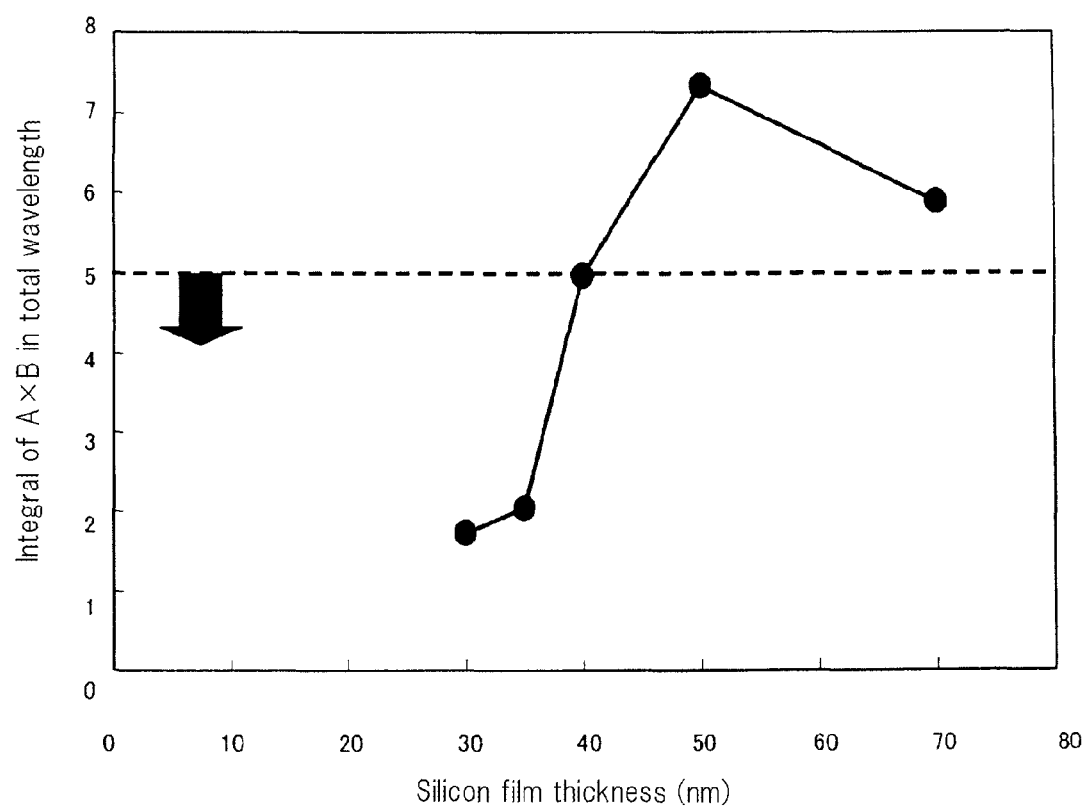
FIG. 14 is a graphical diagram illustrative of the correlation between the thickness of a semiconductor film (silicon) of a light-emitting diode and the integral of a spectrum thereof.

FIG. 14 shows the correlation between the thickness of a semiconductor film (silicon film) and the integral of a spectrum when a light source is a light-emitting diode.

The integral of a spectrum is a value of integrating A×B over the total wavelength range (nm), where A (a function of a wavelength $\lambda$: $A(\lambda)$) is a relative intensity spectrum obtained by normalizing a luminescence spectrum of the respective wavelengths by the maximum value of the luminescence spectrum of the light source, and B (a function of a wavelength $\lambda$: $B(\lambda)$) is a relative intensity spectrum obtained by normalizing an absorption spectrum of the respective wavelengths by the maximum value of the absorption spectrum of the semiconductor film. Here, the total wavelength range may be a wavelength range ($\lambda$min to $\lambda$max, unit: nm) including a luminescence wavelength of a light source. For example, when using visible rays as a light source, the wavelength range may be set to 380 nm to 800 nm or 400 nm to 800 nm. Further, the maximum value of the absorption spectrum of the semiconductor film means a maximum value in a luminescence wavelength region of a light source.

The integral of the spectrum can be expressed as following equation. In equation, $\lambda$min and $\lambda$max indicate a maximum value (nm) and a minimum value (nm), respectively in the total wavelength region.

$$\text{The integral of spectrum} = \int_{\lambda_{min}}^{\lambda_{max}} A(\lambda) \times B(\lambda) d\lambda \qquad \text{Equation 1}$$

From FIG. 14, it can be seen that in case of using an LED backlight as a light source, the dependence of the integral of spectrum upon the film thickness is consistent with the dependence of a leakage photocurrent characteristic upon the film thickness (see FIG. 2).

It can be seen that when the film thickness is in a rage of 50 nm to 70 nm, the integral of spectrum increases as the film thickness decreases. This is because a peak of the luminescence intensity of the light source overlaps with that of an absorption characteristic of the silicon film when the film thickness is 50 nm. Like this, reduction in leakage photocurrent does not simply result from thinning of a silicon film, but is influenced by dependence of a luminescence spectrum of illumination light (here, the LED backlight) and an absorption characteristic of a semiconductor film (here, silicon film) upon a film thickness. Further, if the film thickness decreases, the integral of a spectrum greatly varies near the film thickness of 40 nm. That is, the thickness of the semiconductor film that the integral of the spectrum amounts to 5 or less is 40 nm or less.

As aforementioned above, because of the thing that a wavelength subject to absorption exists according to a film thickness and because of the thing that dependence of a luminescence spectrum, i.e. luminescence intensity, upon a wavelength exists according to the types of light sources, extent of light absorption (as a result leakage photocurrent) varies according to the characteristics. A leakage photocurrent characteristic can be evaluated by the integral of a spectrum that generalizes the above relationship. In other words, from a point of restricting leakage photocurrent, it is preferred that a peak of a luminescence spectrum of a light source and a peak of an absorption spectrum of a semiconductor film barely overlap with each other. Because of this aspect, the integral of a spectrum is preferably 5 or less, more preferably 3 or less. Since a lower limit of the integral of the spectrum becomes zero in an ideal state where overlapping of spectrums does not occur, the lower limit preferably exceeds zero. In order to make the integral of a spectrum have such a range, types of light source and/or a thickness or a material including a granular diameter, a density or the like, of a semiconductor film are selected. Otherwise, in regard to a certain light source, a thickness or a material including a granular diameter, a density or the like, of a semiconductor film is selected. Thus, it is possible to obtain a semiconductor device in which leakage photocurrent is restricted.

Fourth Exemplary Embodiment

Figure 15:
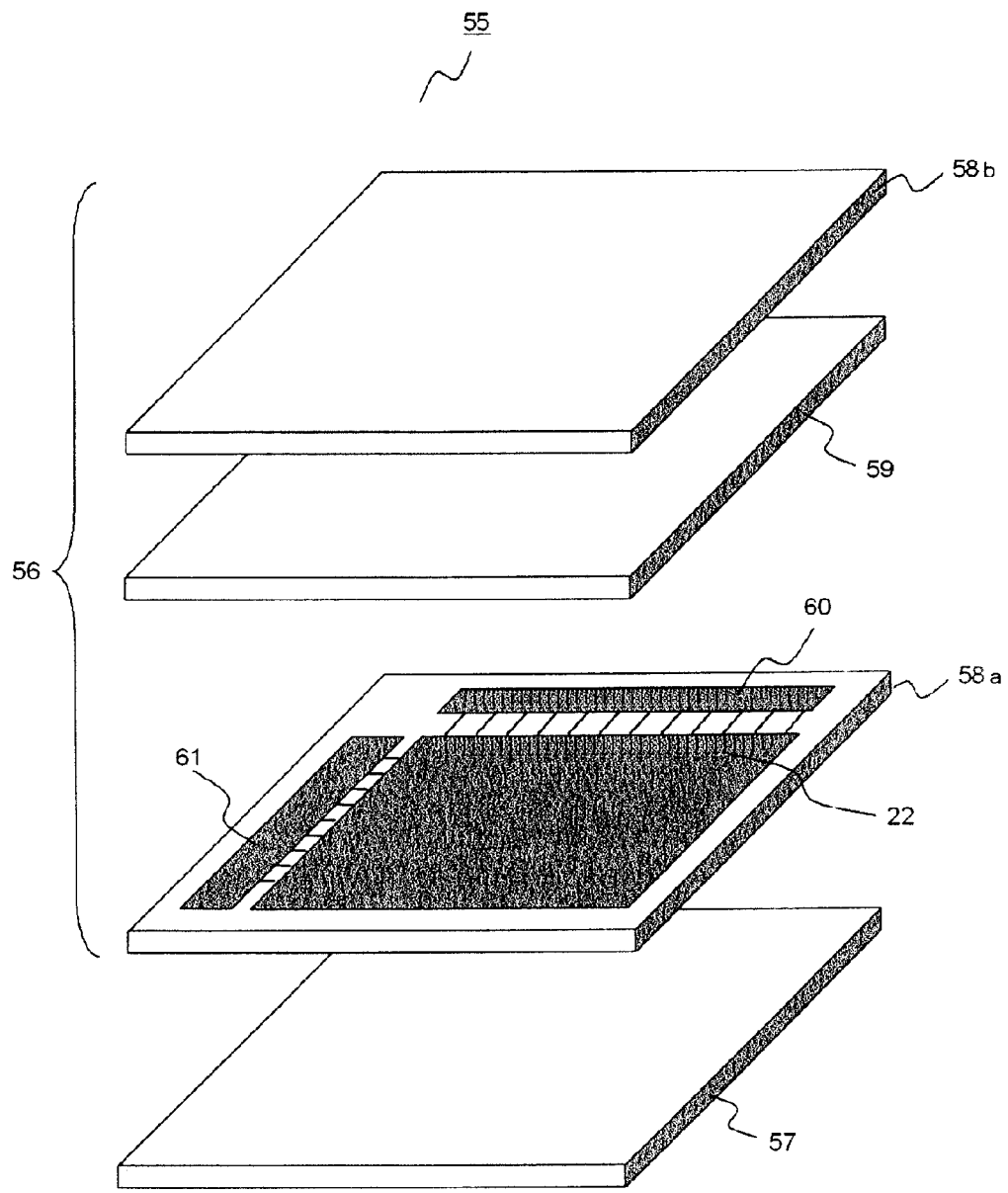
FIG. 15 is an exploded perspective view illustrative of a liquid crystal display device according to $4^{th}$ exemplary embodiment.

Continuously, a fourth exemplary embodiment will be described. The exemplary embodiment provides a liquid crystal display device having the semiconductor device according to the foregoing exemplary embodiment. FIG. 15 is a conceptual exploded perspective view illustrative of a liquid crystal display device.

Liquid crystal display device 55 includes liquid crystal panel 56 and backlight unit 57. Backlight unit 57 includes a light source such as a cold cathode fluorescent lamp, a light-emitting diode, or the like. Liquid crystal panel 56 includes a pair of supporting substrates 58a and 58b sustaining therebetween liquid crystal 59; data circuit 60, scan circuit 61 and display area 22 provided on one supporting substrate 58a; a common electrode (not shown) provided on another supporting substrate 58b; and a polarizer (not shown) provided on both an incidence face and a projection face of liquid crystal panel 56.

To data circuit 60 and scan circuit 61, a data line and a scan line are connected so that display area 22 of liquid crystal panel 56 is divided into a plurality of pixels.

Data circuit 60 and scan circuit 61 are provided with the semiconductor device of the foregoing exemplary embodiment, and the respective pixels are also provided with the semiconductor device of the exemplary embodiment.

Thus, according to the operation of the aforementioned configurations, even when light from backlight unit 57 is incident upon the semiconductor device in the liquid crystal panel 56, carriers are restricted from flowing between source/drain as leakage photocurrent, thereby avoiding degradation of an image quality such as flicker.

Further, with provision of the low-concentration region of the configuration D, reduction in breakdown voltage between source and drain is restricted, thereby improving reliability.

Further, since the sheet resistance of the high-concentration region of the semiconductor device is sufficiently low, and even when a low-concentration region is provided, the low-concentration region has proper sheet resistance, power consumption of the liquid crystal display device can be reduced.

Furthermore, since the integral of a spectrum is set to 5 or less because of the relationship with a light source, excellent display characteristic can be obtained even when high luminance backlight unit 57 is used.

Fifth Exemplary Embodiment

Continuously, a fifth exemplary embodiment will be described. The exemplary embodiment relates to an electronic apparatus using the semiconductor device according to the foregoing exemplary embodiments. While a mobile phone having the liquid crystal display device will be illustrated and described as an electronic apparatus, the invention is not limited thereto, but may include for example personal computers, personal digital assistances (PDAs), projectors, digital (video) cameras, or the like.

Figure 16:
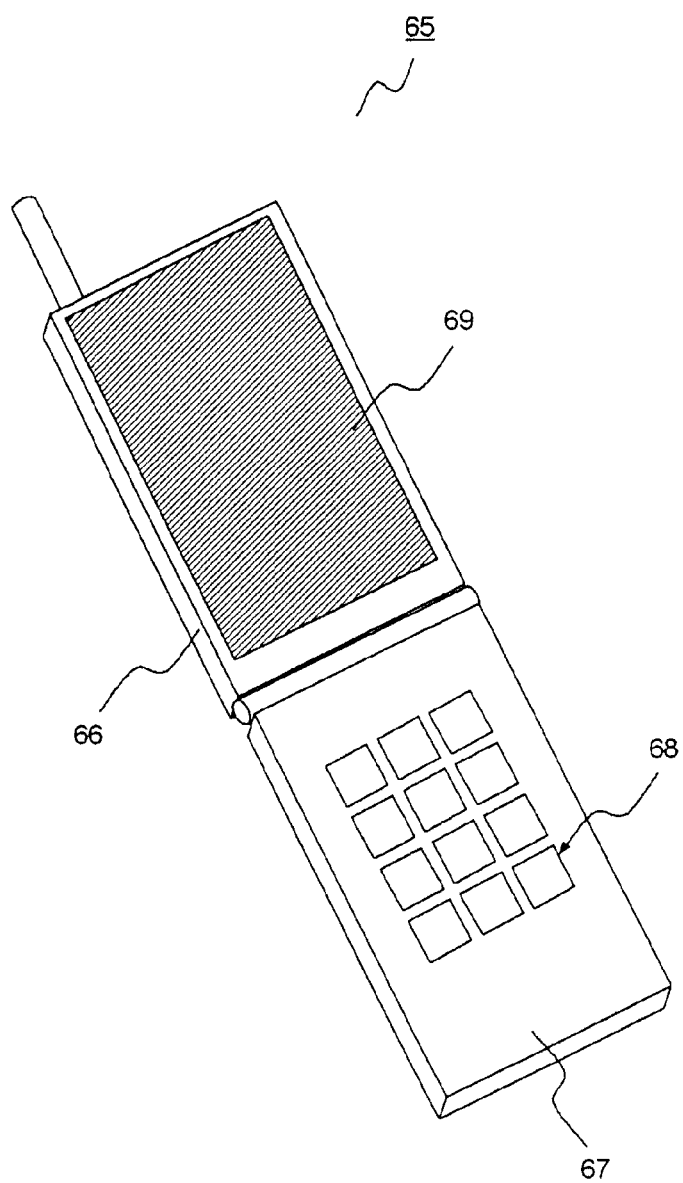
FIG. 16 is a perspective view illustrative of an electronic apparatus (portable phone) according to $5^{th}$ exemplary embodiment.

FIG. 16 is a perspective view illustrative of mobile phone 65 having the liquid crystal display device. Mobile phone 65 includes upper case 66 and lower case 67. Upper case 66 is provided with liquid crystal display device 69 according to the foregoing exemplary embodiment, and lower case 67 is provided with an input device including a numerical keypad. Further, the mobile phone also includes in the cases a device having a function required for a mobile phone, which device includes a transmitting and receiving apparatus, various controllers, a memory, a voice unit having a speaker and a microphone, a battery, and the like.

Since liquid crystal display device 69 restricts leakage photocurrent and power consumption, even when high luminance backlight unit is used, it can provide a relatively long-term, excellent display characteristic, so that a mobile phone having excellent visibility can be obtained.

Further, in the liquid crystal display device of the invention, such a backlight unit as having high luminance can be used, so that the device is applicable to a view finer of e.g. as a video camera that is used in a dark place.

Having thus described the present invention with reference to the exemplary embodiments, the invention is not limited to the above-described exemplary embodiments. Various modifications understandable to those skilled in the art may be made to the constitution and details of the present invention within the scope thereof.

This application is based upon and claims the benefit of priority from Japanese Patent Application No. 2008-096530, filed on Apr. 2, 2008, the disclosure of which is incorporated herein in its entirety by reference.

The invention claimed is:

1. A semiconductor device comprising:
a supporting substrate;
a semiconductor film on the supporting substrate;
a gate insulating film on the semiconductor film;
a gate electrode on the gate insulating film; and
a source region and a drain region formed by introducing boron to the semiconductor film,
wherein a thickness of the semiconductor film is within a range of 20 nm to 40 nm,
the semiconductor device further comprises low-concentration regions provided between the source region and a channel forming region, and between the drain region and the channel forming region, respectively, the low-concentration regions each having a boron concentration smaller than that of the source region and that of the drain region, and the boron concentration in a lower surface side region on a side of the supporting substrate being smaller than that of an upper surface side region on the opposite side, and
the semiconductor film is configured such that the integral of product A×B over the total wavelength range (nm) is not more than 5, where A is a relative intensity spectrum obtained by normalizing a luminescence spectrum of incident light upon the semiconductor film, by the maximum value of the luminescence spectrum, B is a relative intensity spectrum obtained by normalizing an absorption spectrum of the semiconductor film by the maximum value of the absorption spectrum, and the incident light has a wavelength range of 400 nm to 800 nm.

2. A liquid crystal display device, comprising:
a liquid crystal panel comprising a semiconductor device; and
a light source illuminating the liquid crystal panel,
wherein the semiconductor device comprises:
a supporting substrate;
a semiconductor film on the supporting substrate;
a gate insulating film on the semiconductor film;
a gate electrode on the gate insulating film; and
a source region and a drain region formed by introducing boron to the semiconductor film; and
the semiconductor film is configured such that the integral of product A×B over the total wavelength range (nm) is not more than 5, where A is a relative intensity spectrum obtained by normalizing a luminescence spectrum of incident light upon the semiconductor film from the supporting substrate side for illuminating the liquid crystal panel, by the maximum value of the luminescence spectrum, B is a relative intensity spectrum obtained by normalizing an absorption spectrum of the semiconductor film by the maximum value of the absorption spectrum, and a wavelength of the incident light has a range of 400 nm to 800 nm.

3. An electronic apparatus comprising the liquid crystal display device according to claim 2.

4. A semiconductor device comprising:
a supporting substrate;
a semiconductor film on the supporting substrate;
a gate insulating film on the semiconductor film;
a gate electrode on the gate insulating film; and
a source region and a drain region formed by introducing boron to the semiconductor film,
wherein a thickness of the semiconductor film is within a range of 20 nm to 40 nm,
the semiconductor device further comprises low-concentration regions provided between the source region and a channel forming region, and between the drain region and the channel forming region, respectively, the low-concentration regions each having a boron concentration smaller than that of the source region and that of the drain region, and the boron concentration in a lower surface side region on a side of the supporting substrate being smaller than that of an upper surface side region on the opposite side, a sheet resistance of each of the low-concentration region has a range of $3\times10^5$ $\Omega/\square$ to $2\times10^7$ $\Omega/\square$, and
the source region and the drain region each comprise a region having a boron concentration in a range of $3.1\times10^{18}$ $cm^-$ to $3.4\times10^{20}$ $cm^-$ along a thickness direction from the lower surface of the semiconductor film on the side of the supporting substrate.

5. A semiconductor device comprising:
a supporting substrate;
a semiconductor film on the supporting substrate;

a gate insulating film on the semiconductor film;
a gate electrode on the gate insulating film; and
a source region and a drain region formed by introducing boron to the semiconductor film,
wherein a thickness of the semiconductor film is within a range of 20 nm to 40 nm,
the semiconductor device further comprises low-concentration regions provided between the source region and a channel forming region, and between the drain region and the channel forming region, respectively, the low-concentration regions each having a boron concentration smaller than that of the source region and that of the drain region, and the boron concentration in a lower surface side region on a side of the supporting substrate being smaller than that of an upper surface side region on the opposite side,
a sheet resistance of each of the low-concentration region has a range of $3 \times 10^5 \Omega/\square$ to $1 \times 10^6 \Omega/\square$, and
the source region and the drain region each comprise a region having a boron concentration in a range of $3.1 \times 10^{18}$ cm$^{-3}$ to $3.4 \times 10^{20}$ cm$^{-3}$ along a thickness direction from the lower surface of the semiconductor film on the side of the supporting substrate.

6. A semiconductor device comprising:
a supporting substrate;
a semiconductor film on the supporting substrate;
a gate insulating film on the semiconductor film;
a gate electrode on the gate insulating film; and
a source region and a drain region formed by introducing boron to the semiconductor film,
wherein a thickness of the semiconductor film is within a range of 20 nm to 40 nm,
the semiconductor device further comprises low-concentration regions provided between the source region and a channel forming region, and between the drain region and the channel forming region, respectively, the low-concentration regions each having a boron concentration smaller than that of the source region and that of the drain region, and the boron concentration in a lower surface side region on a side of the supporting substrate being smaller than that of an upper surface side region on the opposite side,
a sheet resistance of each of the low-concentration region has a range of $3 \times 10^5 \Omega/\square$ to $2 \times 10^7 \Omega/\square$, and
the semiconductor film is configured such that the integral of product A×B over the total wavelength range (nm) is not more than 5, where A is a relative intensity spectrum obtained by normalizing a luminescence spectrum of incident light upon the semiconductor film, by the maximum value of the luminescence spectrum, B is a relative intensity spectrum obtained by normalizing an absorption spectrum of the semiconductor film by the maximum value of the absorption spectrum, and the incident light has a wavelength range of 400 nm to 800 nm.

7. A semiconductor device comprising:
a supporting substrate;
a semiconductor film on the supporting substrate;
a gate insulating film on the semiconductor film;
a gate electrode on the gate insulating film; and
a source region and a drain region formed by introducing boron to the semiconductor film,
wherein a thickness of the semiconductor film is within a range of 20 nm to 40 nm,
the semiconductor device further comprises low-concentration regions provided between the source region and a channel forming region, and between the drain region and the channel forming region, respectively, the low-concentration regions each having a boron concentration smaller than that of the source region and that of the drain region, and the boron concentration in a lower surface side region on a side of the supporting substrate being smaller than that of an upper surface side region on the opposite side,
a sheet resistance of each of the low-concentration region has a range of $3 \times 10^5 \Omega/\square$ to $1 \times 10^6 \Omega/\square$, and the semiconductor film is configured such that the integral of product A×B over the total wavelength range (nm) is not more than 5, where A is a relative intensity spectrum obtained by normalizing a luminescence spectrum of incident light upon the semiconductor film, by the maximum value of the luminescence spectrum, B is a relative intensity spectrum obtained by normalizing an absorption spectrum of the semiconductor film by the maximum value of the absorption spectrum, and the incident light has a wavelength range of 400 nm to 800 nm.

8. A semiconductor device comprising:
a supporting substrate;
a semiconductor film on the supporting substrate;
a gate insulating film on the semiconductor film;
a gate electrode on the gate insulating film; and
a source region and a drain region formed by introducing boron to the semiconductor film,
wherein a thickness of the semiconductor film is within a range of 20 nm to 40 nm,
the semiconductor device further comprises low-concentration regions provided between the source region and a channel forming region, and between the drain region and the channel forming region, respectively, the low-concentration regions each having a boron concentration smaller than that of the source region and that of the drain region, and the boron concentration in a lower surface side region on a side of the supporting substrate being smaller than that of an upper surface side region on the opposite side,
the source region and the drain region each comprise a region having a boron concentration in a range of $3.1 \times 10^{18}$ cm$^{-3}$ to $3.4 \times 10^{20}$ cm$^{-3}$ along a thickness direction from the lower surface of the semiconductor film on the side of the supporting substrate, and
the semiconductor film is configured such that the integral of product A×B over the total wavelength range (nm) is not more than 5, where A is a relative intensity spectrum obtained by normalizing a luminescence spectrum of incident light upon the semiconductor film, by the maximum value of the luminescence spectrum, B is a relative intensity spectrum obtained by normalizing an absorption spectrum of the semiconductor film by the maximum value of the absorption spectrum, and the incident light has a wavelength range of 400 nm to 800 nm.

9. The semiconductor device according to claim 1, wherein the integral is obtained in accordance with Equation 1:

$$\text{The integral of spectrum} = \int_{\lambda_{min}}^{\lambda_{max}} A(\lambda) \times B(\lambda) d\lambda \quad \text{Equation 1.}$$

10. The liquid crystal display device according to claim 2, wherein the integral is obtained in accordance with Equation 1:

$$\text{The integral of spectrum} = \int_{\lambda_{min}}^{\lambda_{max}} A(\lambda) \times B(\lambda) d\lambda \quad \text{Equation 1.}$$

11. The semiconductor device according to claim 6, wherein the integral is obtained in accordance with Equation 1:

$$\text{The integral of spectrum} = \int_{\lambda_{min}}^{\lambda_{max}} A(\lambda) \times B(\lambda) d\lambda \quad \text{Equation 1.}$$

12. The semiconductor device according to claim 7, wherein the integral is obtained in accordance with Equation 1:

$$\text{The integral of spectrum} = \int_{\lambda_{min}}^{\lambda_{max}} A(\lambda) \times B(\lambda) d\lambda \quad \text{Equation 1.}$$

* * * * *

UNITED STATES PATENT AND TRADEMARK OFFICE
CERTIFICATE OF CORRECTION

PATENT NO.        : 8,570,455 B2                                    Page 1 of 1
APPLICATION NO. : 12/934659
DATED             : October 29, 2013
INVENTOR(S)       : Mori et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 351 days.

Signed and Sealed this
Twenty-second Day of September, 2015

Michelle K. Lee
*Director of the United States Patent and Trademark Office*